United States Patent [19]

Smith

[11] Patent Number: 5,275,839

[45] Date of Patent: Jan. 4, 1994

[54] METHOD OF SENSITIZING LEAD SALT DETECTORS

[75] Inventor: Thomas W. Smith, Deltona, Fla.

[73] Assignee: Graseby Electro-Optics, Inc., Orlando, Fla.

[21] Appl. No.: 991,465

[22] Filed: Dec. 16, 1992

[51] Int. Cl.$^5$ .............................................. B05D 5/12
[52] U.S. Cl. .................................... 427/8; 427/74; 427/75; 427/76; 427/282; 427/287; 427/372.2; 250/208.1; 437/3; 437/5; 437/7; 437/8
[58] Field of Search ................ 427/8, 74, 75, 76, 160, 427/282, 287, 372.2; 250/208.1; 437/3, 5, 7, 8

[56] References Cited

U.S. PATENT DOCUMENTS

| | | | |
|---|---|---|---|
| 2,809,132 | 10/1957 | Bloem | 117/200 |
| 2,997,409 | 8/1961 | McLean | 117/201 |
| 3,178,312 | 1/1959 | Johnson | 117/201 |
| 3,356,500 | 9/1964 | Autrey | 96/36 |
| 4,682,032 | 7/1987 | Barrett | 250/352 |
| 4,689,246 | 8/1987 | Barrett | 427/76 |
| 5,138,145 | 8/1992 | Nakamura et al. | 250/208.1 |

*Primary Examiner*—Shrive Beck
*Assistant Examiner*—David M. Maiorana

*Attorney, Agent, or Firm*—William M. Hobby, III

[57] ABSTRACT

A method for sensitizing lead salt infrared detectors includes the step of making a photomask for depositing a lead salt material on a substrate for forming a plurality of detectors in which each detector is electrically coupled in series to at least one other detector on the substrate. A lead salt material, such as lead sulfide or lead selenide, is deposited onto the substrate through the photomask to form a plurality of lead salt detectors connected in series on a substrate. A monitor is connected across a series of interconnecting detectors on the substrate and the substrate is immersed in a heated chemically inert liquid, such as a fluorocarbon liquid, for a predetermined time period to sensitize the lead salt detectors on the substrate while simultaneously monitoring the detectors across the substrate in the heated liquid. The monitor produces an average reading of the resistance for each detector on the substrate to determine when to remove the detectors from the heated liquid. The substrate is then removed from the heated liquid and the separate infrared detectors are separated from each other to form a plurality of lead salt detectors.

8 Claims, 1 Drawing Sheet

METHOD OF SENSITIZING LEAD SALT DETECTORS

BACKGROUND OF THE INVENTION

The present invention relates to a method of sensitizing lead salt infrared detectors and especially to a method for sensitizing a lead sulfide or lead selenide infrared detector.

In the past, many materials have been known which can be excited by the absorption of infrared energy to provide a useful electrical signal. Some of these detectors of infrared energy take advantage of the fact that a change in conductivity occurs in the material when heating with infrared radiation. This change in conductivity is thus used to modulate a signal impressed across the infrared sensitive material. These device are satisfactory for some purposes but the reaction time in such devices is inherently long since the operation depends entirely upon a thermal affect. Another type of detector employs certain materials which operate on the photoconductive principal such that when the material is excited by absorption of infrared energy, there is a change in conductivity in the material. Certain of these photoconductive materials can be prepared which have very short time constants. Lead salts provide some of the most sensitive materials for the detection of infrared energy at certain wavelengths and especially lead selenide and lead sulfide materials. An infrared detector utilizing these materials usually comprises a thin film of lead selenide or lead sulfide on a substrate with electrical leads connected to opposite sides of the thin film or layer. The thin film of lead salt can be formed by either vacuum evaporation or deposition onto the substrate or by chemically depositing onto the substrate from a solution. The vapor deposition technique has been found to be extremely difficult to control. On the other hand, a chemical deposition from solution technique has also been far from satisfactory in that frequently the precipitation of the lead salt has had poor adherence to the substrate.

Lead salts are typically deposited on the substrates in a manner to form a plurality of infrared detectors simultaneously. First a photomask is made up of the exact shape of the detectors to be formed on the substrate. The photomask is applied directly to the substrate such that the lead salt material is deposited in the exact positions through the photomask to form the desired detectors. Once the lead salt is deposited on the substrate, the lead salt is sensitized by oxidizing the lead salt by positioning the substrate and the lead salt at an elevated temperature for a predetermined time. It is known in the industry that the sensitization of the lead salt material, such as a lead sulfide or lead selenide, is one of the more critical or more difficult processes to control. The sensitization process is the conversion or oxidation of the lead sulfide material using elevated temperatures and time. The resistance of the material is the test most commonly used to determine the useful range of the material as a detector. Presently, the method used is to bake a group of detectors for a set period of time. The resistance of the detectors is measured to determine how long in time the remaining detectors will be baked. The problem associated with this method is the changing conditions in the oven and the room that the oven is residing in which usually gives different results from the evaluation. An alternative method is to bake all the detectors at the same time which has been unacceptable as the resistance target moves from deposition to deposition. Any difference in the deposition process or environmental conditions and the final resistance values is thereby different.

The present invention relates to a process of improving sensitization of the lead salt materials placed on a substrate, such as a quartz plate, having each electrical lead contacting an electrical lead of another detector so that a monitor can be placed across the series connected plurality of detectors formed on a single substrate to monitor the resistance through all of the detectors simultaneously and then immersing the substrate and detectors still connected to the monitor in a heated inert liquid, such as a heated fluorocarbon liquid, at a predetermined temperature until the monitor provides a reading through all of the detectors which can be averaged to determine the desired resistance for each detector. The substrate with the sensitized detectors can be removed from the heated liquid and further processed and separated into individual detectors.

A great variety of prior art patents have dealt with the making of infrared detectors and especially with infrared detectors made with lead salt materials, including both the detectors and processes for making the detectors. In the U.S. Pat. No. 2,997,407, to McLean, a method of production of a lead selenide photodetector is provided which seeks a high degree of reliability in the production of the detector cells which applies a layer of selenide to a suitable substrate, oxidizes the layer of selenide at an elevated temperature, and applies a controlled amount of selenium to the oxidized layer of selenide. In the U.S. Pat. No. 3,178,312, to Johnson, solutions and methods for depositing lead selenide in situ on a substrate of a polycrystaline layer of a thin film of lead selenide by chemical deposition is illustrated. In the U.S. Pat. No. 2,809,132, to Bloem, a method of coating a support with a lead sulfide layer, such as lead sulfide is shown. The Autrey U.S. Pat. No. 3,356,500, shows the production of infrared detector patterns using lead selenide or lead sulfide and delineates the film areas for complex detector array patterns. In the Barrett U.S. Pat. No. 4,689,246, a method of fabricating a lead salt infrared detector array on a silicon wafer which does not employ individual bonded leads between the infrared sensitive elements and the input stages of the multiplexers is provided. In the Barrett patent, No. 4,682,032, a Joule-Thomson cryostat having a chemically deposited infrared detector is provided and a method of manufacturing the infrared detector in which the infrared detectors are integrally deposited on a Joule-Thomson cryostat to permit efficient cooling of the detectors. In the Nakamura et al. U.S. Pat. No. 5,138,145, a method for the production of image sensors has a simplified chip mounting technique.

The present invention, on the other hand, deals with an improved technique for sensitizing the lead salt infrared detectors which have been deposited on a substrate and includes making a photomask which interconnects the sensor material leads on the substrate plate for simultaneously monitoring the resistance of an entire batch of sensors being oxidized at an elevated temperature and monitoring the batch during sensitization to determine temperature/time for each batch.

SUMMARY OF THE INVENTION

A method for sensitizing lead salt infrared detectors includes the step of making a photomask for depositing a lead salt material on a substrate for forming a plurality of detectors in which each detector is electrically coupled in series to at least one other detector on the substrate. A lead salt material, such as lead sulfide or lead selenide, is deposited onto the substrate through the photomask to form a plurality of lead salt detectors connected in series on a substrate. A monitor is connected across a series of interconnecting detectors on the substrate and the substrate is immersed in a heated chemically inert liquid, such as a fluorocarbon liquid, for a predetermined time period to sensitize the lead salt detectors on the substrate while simultaneously monitoring the detectors across the substrate in the heated liquid. The monitor produces an average reading of the resistance for each detector on the substrate to determine when to remove the detectors from the heated liquid. The substrate is then removed from the heated liquid and the separate infrared detectors are separated from each other to form a plurality of lead salt detectors.

BRIEF DESCRIPTION OF THE DRAWINGS

Other objects, features, and advantages of the present invention will be apparent from the written description and the drawing in which.

DETAILED DESCRIPTION OF THE INVENTION

Figure 1:
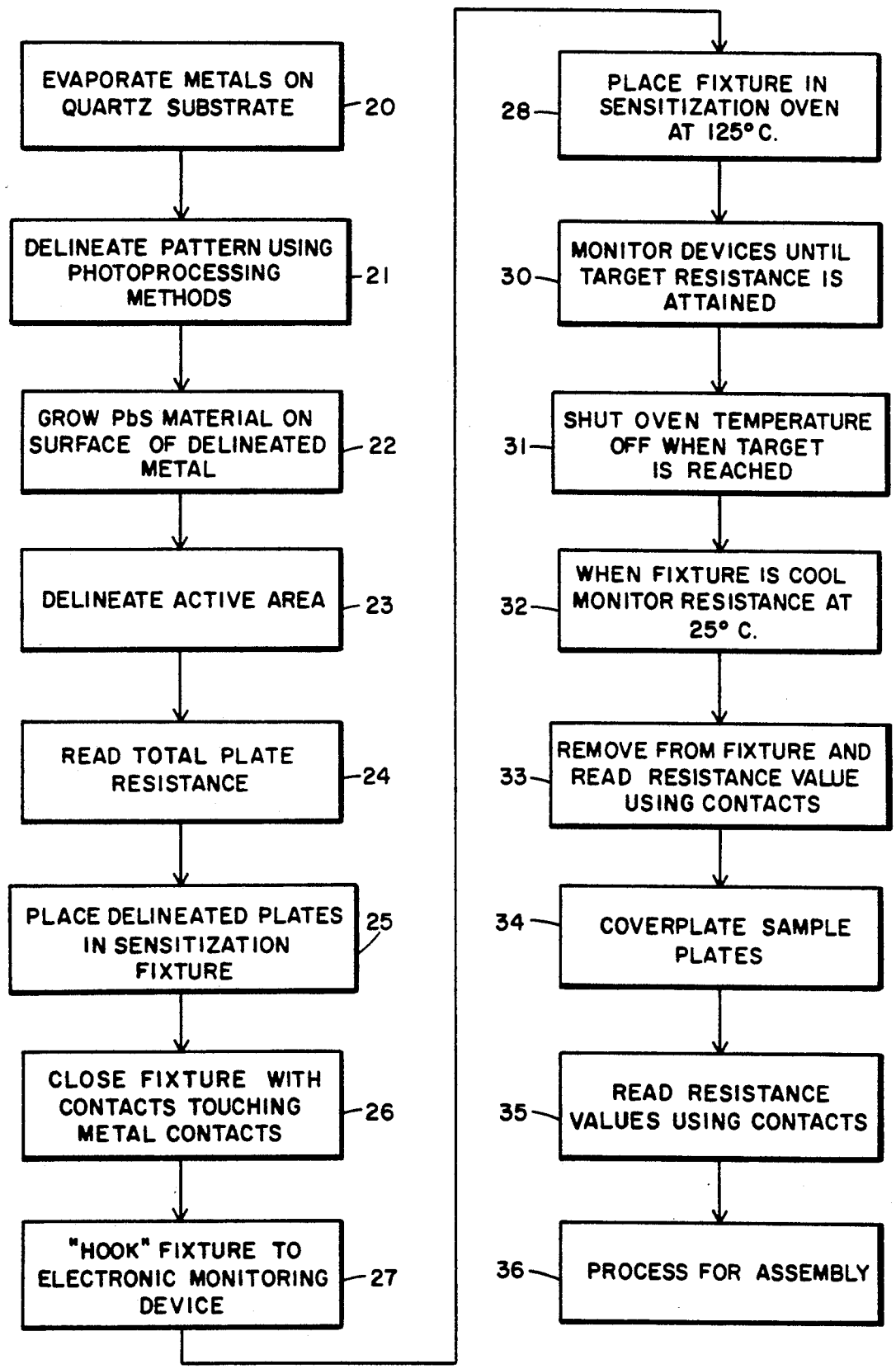
FIG. 1 is a flow diagram for sensitization monitoring in accordance with the present invention.

The present invention monitors the resistance in series connected lead salt type infrared detectors which are series connected onto a substrate while providing a more highly controlled environment for sensitizing the detectors. The process includes the designing of a photomask to link the detectors on a substrate or quartz plate such that traces of each detector is connected to another detector to provide a series or linked connection through all of the detectors placed on a substrate. The lead salt material, either a lead sulfide or lead selenide, are deposited on the substrate through the photomask and are interconnected or linked throughout the substrate surface. The substrate plates are then connected in series so that a monitor connected across all of the detectors provides a total resistance reading and an average of all of the detectors in one deposition run. The detectors are immersed in a fluorocarbon liquid, such as a flouronert or a similar material, that can withstand very high temperatures with very little evaporation. Since the materials are chemically inert, no reaction with the lead salts takes place and the material is heated to an elevated temperature ranging from 125-150° C. The plates or detectors are then immersed in the liquid for a predetermined set length of time and have a monitor connected across the series linked detectors. The monitor can thereby measure the resistance from outside the tank through all of the detectors connected in series and determine an average resistance for each of the detectors in the tank of heated inert liquid. When the resistance value at temperature is reached that correlates with the room temperature value, the plates or detectors are removed and subsequent processing can continue. This allows the lead salts to be sensitized more accurately during the conversion or oxidation of the lead sulfide materials using the elevated temperature and time. Resistance of the material is the test used to determine the useful range of the material as a detector, and all the interconnected detectors are from the same deposition batch, which batch has been highly controlled. The material is deposited through a photomask which mask has been designed to link each of the photodetectors together so they can be monitored for more accurate sensitization of each of the infrared detectors. Thus, the method employs a heated fluorocarbon liquid for the sensitization process using quartz plates which have been photomasked and had deposited therein the lead salt material to form detectors electrically linked in series to allow the total measurement of the detectors on a plate while the sensitization process takes place to provide infrared detectors in which the resistance of each is within the useful range for an infrared detector. The process avoids the prior methods of making a group of detectors using an estimated bake time or estimating the bake time by taking measurements of one plate for judging the bake time of all plates.

Referring to FIG. 1, a flow diagram for sensitization monitoring of infrared detectors in the making of the detectors is illustrated. The flow diagram starts with the evaporation (20) of metals onto a quartz substrate using delineated patterns through photoprocessing (21) which metal deposits on the substrates are inspected and have lead sulfide material grown (22) on the surface of the delineated metal surface on the quartz substrate which delineates (23) the lead sulfate or lead selenide action area on the surface. After an inspection, the total plate resistance for all of the individual delineated active areas is read (24) and the plates are placed (25) in the sensitization fixture. The sensitization fixture is closed (26) with the monitor contacts coupled to the metal contacts. The sensitization fixture is hooked (27) to the electric monitoring device two electrodes for measuring the resistance through all of the electrically connected coated substrates from which the connected substrates are placed (28) in a fixture in a sensitization oven at 125° C. The resistance is monitored (30) through all the electrically connected detector surface areas until the target resistance is obtained at which time the oven temperature is shut off (31) (when the target temperature is reached). The fixture is cooled (22) until the monitor resistance reaches 25° C. at which time it is removed from the sensitization fixture and the resistance value is read (32) using the contacts thereon. Thereafter, the sensitized lead salt or lead selenide surfaces on the metalized coated substrates are coverplated (34) with sample plates and the resistance is read using the contacts (35) and the sensitized detectors continue through the process assembly (36) to complete the individual infrared detectors.

The process of sensitizing lead salt infrared detectors includes the steps of making a photomask for a substrate quartz plate for depositing lead salt materials, specifically lead sulfide or lead selenide, for making a plurality of infrared detectors. The photomask is formed to electrically couple each of the plurality of detectors linked to each other on the substrate plate, all of which have been deposited in the same batch. The lead salt materials are then deposited onto the substrate plate through the photomask to form a plurality of lead salt detectors connected in series on the substrate. A monitor is then connected across the series of interconnected detectors on the substrate plate. The detectors are then sensitized by immersing the substrate having the lead salt detectors formed thereon and with the monitor connected thereacross into a heated fluorocarbon liquid heated to a temperature between 125° and 150° C. for a predetermined time period determined by the monitoring of the resistance through all detectors to thereby sensitize the lead salt detectors on the substrate. The monitoring of the detectors across the substrate, which reads the resistance through the series connected detectors, can determine an average resistance for each detector and when the average detector reading reaches the desired resistance through the detector, the plate having the detectors thereon is removed from the heated fluorocarbon liquid. The detectors are separated from each other so that the infrared detectors are more accurately sensitized for reading a predetermined range of infrared impinging on their surface.

It should be clear at this time that a method for sensitizing lead salt and lead selenide materials on a substrate has been provided which gives a more accurate sensitization through constant monitoring during the sensitizing in a submersed fluorocarbon liquid. However, the present invention should not be considered as limited to the forms shown which are to be considered illustrative rather than restrictive.

I claim:

1. A method of sensitizing lead salt infrared detectors comprising the steps of:
    making a photomask for depositing a lead salt material on a substrate plate for forming a plurality of detectors, each detector being electrically coupled in series to at least one other detector on the substrate plate;
    applying said photomask to a substrate;
    depositing a lead salt material onto a substrate plate through said photomask to form a plurality of lead salt detectors connected in series on said substrate plate;
    connecting a monitor across said series of interconnected detectors on said substrate plate;
    immersing said substrate plate having said plurality of detectors thereon in a heated liquid to sensitize said lead salt detectors on said substrate plate;
    monitoring the combined resistance in said series of detectors on said substrate plate while in said heated liquid;
    removing said substrate plate from said heated liquid after a time period as indicated by the monitor readings of the resistance in said series of detectors; and
    separating said sensitized infrared detectors on said substrate plate, whereby improved sensitization is obtained in lead salt detectors.

2. A method of sensitizing lead salt infrared detectors in accordance with claim 1 in which said step of depositing said lead salt material on a substrate plate includes depositing said lead salt on a quartz plate.

3. A method of sensitizing lead salt infrared detectors in accordance with claim 2 in which said step of depositing said lead salt material on a substrate plate includes depositing a lead sulfide on a quartz plate.

4. A method of sensitizing lead salt infrared detectors in accordance with claim 2 in which said step of depositing said lead salt material on a substrate plate includes depositing lead selenide on a quartz plate.

5. A method of sensitizing lead salt infrared detectors in accordance with claim 1 in which said step of immersing said substrate plate in a liquid includes immersing said substrate plate in heated chemically inert fluorocarbon liquid.

6. A method of sensitizing lead salt infrared detectors in accordance with claim 1 in which said step of immersing said substrate plate having said plurality of detectors thereon in a heated liquid includes immersing said substrate plate in a liquid heated to a temperature between 125 and 150 centigrade.

7. A method of sensitizing lead salt infrared detectors in accordance with claim 1 in which said step to removing said substrate plate from said heated liquid after a time period as indicated by monitor readings correlating the average resistance of each detector to determine removal of said substrate plate from said liquid.

8. A method of sensitizing lead salt infrared detectors comprising the steps of:
    making a photomask for depositing a leas salt material on a substrate plate for forming a plurality of detectors, said photomask forming each detector electrically coupled in series to at least one other detector;
    depositing a lead salt material onto a substrate plate through said photomask to form a plurality of lead salt detectors connected in series on said substrate plate;
    connecting a monitor across said series of interconnected detectors on said substrate plate;
    sensitizing said plurality of detectors by oxidizing said detectors inn a heated liquid at a set temperature;
    monitoring the total resistance of said connected detectors on said substrate plate while in said heated liquid;
    removing said substrate plate from said heated liquid after a time period as determined by said monitor reading of total resistance in said connected detectors on said substrate plate; and
    separating said sensitizing infrared detectors on said substrate plate, whereby improved sensitization is obtained in lead salt detectors.

* * * * *